United States Patent
Tokeshi et al.

(10) Patent No.: US 10,959,353 B2
(45) Date of Patent: Mar. 23, 2021

(54) COOLING DEVICE

(71) Applicant: NIDEC CORPORATION, Kyoto (JP)

(72) Inventors: Toshihiko Tokeshi, Kyoto (JP); Takehito Tamaoka, Kyoto (JP); Nobuya Nakae, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/654,016

(22) Filed: Oct. 16, 2019

(65) Prior Publication Data
US 2020/0137929 A1 Apr. 30, 2020

(30) Foreign Application Priority Data
Oct. 24, 2018 (JP) .............................. JP2018-200320

(51) Int. Cl.
*H05K 7/20* (2006.01)

(52) U.S. Cl.
CPC ..... *H05K 7/20927* (2013.01); *H05K 7/20272* (2013.01); *H05K 7/20254* (2013.01)

(58) Field of Classification Search
CPC .............. H01L 23/473; H05K 7/20772; H05K 7/20781; H05K 7/2079; H05K 7/20836; H05K 7/20809; H05K 7/203; H05K 7/20236; H05K 7/20272; H05K 7/20254; H05K 7/20281; H05K 7/20763; H05K 7/20318; H05K 7/20218; H05K 7/20827; H05K 7/20263; H05K 7/20336; H05K 7/2029; H05K 7/20818; H05K 7/20509; H05K 7/20327; H05K 5/067; G06F 1/20; G06F 1/206; G06F 1/203
See application file for complete search history.

(56) References Cited

U.S. PATENT DOCUMENTS

| | | | |
|---|---|---|---|
| 7,212,404 B2 * | 5/2007 | Wang | H01L 23/427 257/E23.088 |
| 7,430,119 B2 * | 9/2008 | Stanley | F04D 13/12 165/104.33 |
| 8,240,166 B2 * | 8/2012 | Nishijima | G03B 21/16 62/259.2 |
| 8,590,331 B2 * | 11/2013 | Corbeil | F28F 1/16 62/259.1 |
| 10,048,008 B1 * | 8/2018 | Mounioloux | F28D 1/05391 |

(Continued)

FOREIGN PATENT DOCUMENTS

JP     2005129812     5/2005

*Primary Examiner* — Adam B Dravininkas
(74) *Attorney, Agent, or Firm* — Keating & Bennett

(57) ABSTRACT

A cooling device is provided with a cooling unit that includes a cold plate extending in a first direction; a pump and a tank disposed on one side in a second direction perpendicular to the first direction of the cold plate; and a partition member extending in the first direction and covering the cold plate on one side in the second direction. The cold plate includes a first refrigerant flow path through which a refrigerant flows in the first direction. The pump includes a pump chamber where a rotating body is accommodated. The tank includes a tank chamber storing the refrigerant and a first tank hole part communicating with the pump chamber. The partition member, including a first hole part that communicates the first flow path and the tank chamber, is provided on one side in the first direction with respect to the first hole part.

3 Claims, 2 Drawing Sheets

(56) References Cited

U.S. PATENT DOCUMENTS

| | | | |
|---|---|---|---|
| 2005/0088820 A1* | 4/2005 | Naganawa | F28F 9/0246 361/697 |
| 2005/0178528 A1* | 8/2005 | Ohashi | G06F 1/20 165/80.3 |
| 2005/0180107 A1* | 8/2005 | Naganawa | H05K 7/20009 361/699 |
| 2007/0000268 A1* | 1/2007 | Crocker | H01L 23/473 62/259.2 |
| 2007/0110592 A1* | 5/2007 | Liu | H01L 23/4006 417/313 |
| 2013/0299139 A1* | 11/2013 | Mounioloux | G06F 1/20 165/120 |
| 2014/0247555 A1* | 9/2014 | Arvelo | H05K 7/20772 361/699 |
| 2014/0318749 A1* | 10/2014 | Katoh | F28D 1/0452 165/140 |

\* cited by examiner

COOLING DEVICE

CROSS REFERENCE TO RELATED APPLICATIONS

This application claims the priority benefit of Japanese Patent Application No. 2018-200320, filed on Oct. 24, 2018. The entirety of the above-mentioned patent application is hereby incorporated by reference herein and made a part of this specification.

BACKGROUND

Technical Field

The present disclosure relates to a cooling device.

Description of Related Art

A conventional cooling system includes a tank and a pump for transferring a refrigerant (for example, Japanese Patent Laid-Open No. 2005-129812).

However, in a conventional cooling system, there are cases in which an amount of refrigerant decreases with use of the cooling system, and air enters a pump chamber. When air enters a pump chamber and a pump is driven in a space with a small amount of refrigerant, there is a possibility that a circulation amount of the refrigerant will decrease, and a cooling efficiency of the cooling system will decrease.

The present disclosure suppresses a decrease in cooling efficiency of a cooling system even when an amount of refrigerant in a cooling system has decreased.

SUMMARY

A cooling device according to one embodiment of the disclosure includes a cooling unit. The cooling unit includes a cold plate which extends in a first direction, a pump and a tank which are disposed on one side in a second direction perpendicular to the first direction of the cold plate, and a partition member which extends in the first direction and covers the cold plate on one side in the second direction. The cold plate includes a first refrigerant flow path through which a refrigerant flows from one side to the other side in the first direction. The pump includes a pump chamber in which a rotating body which transfers the refrigerant is accommodated. The tank includes a tank chamber which stores the refrigerant and a first tank hole part which communicates with the pump chamber. The partition member includes a first hole part which communicates the first refrigerant flow path and the tank chamber, and the first tank hole part is provided on one side in the first direction with respect to the first hole part.

According to the cooling device according to an exemplary embodiment of the present disclosure, a decrease in cooling efficiency of the cooling device can be prevented.

DESCRIPTION OF THE EMBODIMENTS

Hereinafter, an exemplary embodiment of the present disclosure will be described with reference to the drawings.

In the present disclosure, a direction of gravity is referred to as a first direction. A direction in which gravity is applied is referred to as "one side in the first direction," and a direction opposite to one side in the first direction is referred to as "the other side in the first direction." A direction perpendicular to the first direction is referred to as a second direction. A side on which a tank is disposed with respect to a cold plate is referred to as "one side in the second direction," and a surface side of the cold plate opposite to that on which the tank is disposed, that is, a side on which a heat generating component is disposed is referred to as "the other side in the second direction." A direction perpendicular to the first direction and the second direction is referred to as a "third direction," based on which shapes and positional relationships between respective parts will be described.

Also, in the present disclosure, a "parallel direction" includes a substantially parallel direction. Further, in the present disclosure, a "perpendicular direction" includes a substantially perpendicular direction.

EMBODIMENT

Figure 1:
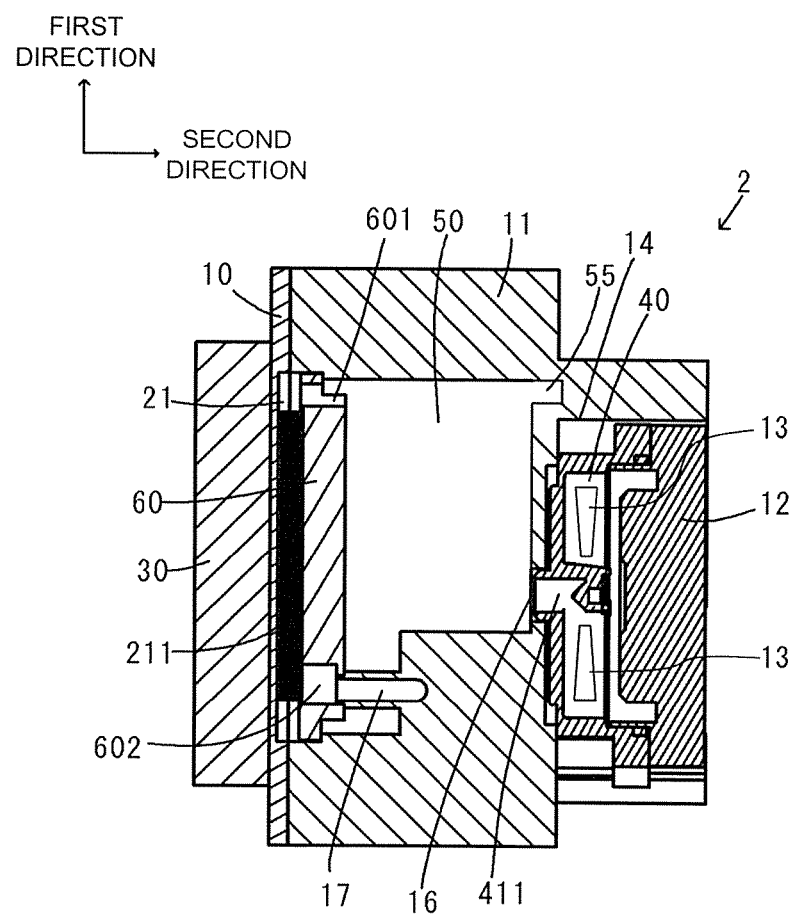
FIG. 1 is a cross-sectional view of a cooling unit according to an exemplary embodiment of the present disclosure.
Figure 2:
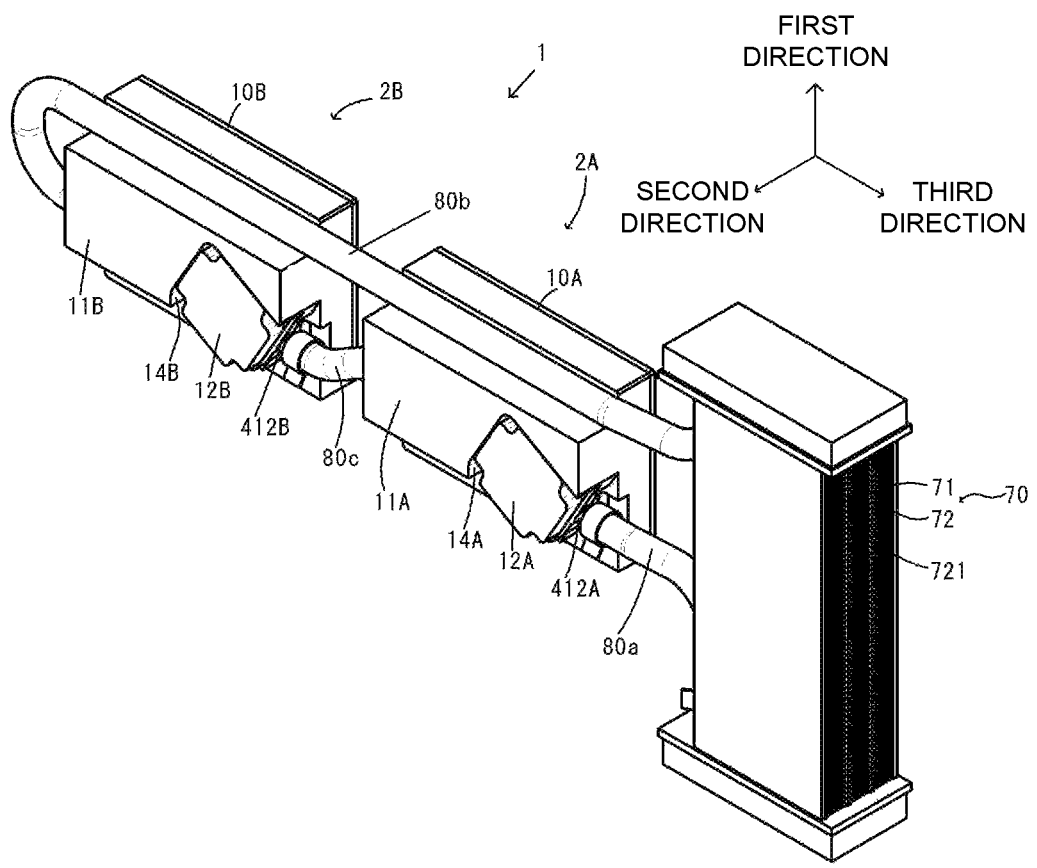
FIG. 2 is a perspective view of a cooling device according to the exemplary embodiment of the present disclosure.

A cooling unit 2 according to an exemplary embodiment of the present disclosure will be described. FIG. 1 is a cross-sectional view of the cooling unit 2 according to the exemplary embodiment of the present disclosure. FIG. 2 is a perspective view of a cooling device 1 according to the exemplary embodiment of the present disclosure.

The cooling device 1 includes the cooling unit 2, a radiator 70, and a connection pipe 80.

The cooling unit 2 includes a cold plate 10, 10A, 10B, a tank 11, 11A, 11B, a pump 12, 12A, 12B, and a partition member 60. The tank 11 and the pump 12 are disposed on one side in the second direction of the cold plate 10. The partition member 60 is disposed between the cold plate 10 and the tank 11 in the second direction.

<Cold Plate>

The cold plate 10 is made of a metal having high thermal conductivity such as copper or aluminum and has a rectangular plate shape extending in the first direction. Further, the cold plate 10 of the present embodiment has a quadrangular shape when viewed from the second direction but is not limited thereto, and may have, for example, a polygonal shape having a plurality of corners or a circular shape when viewed from the second direction. A heat generating component 30 is disposed on the other side in the second direction of the cold plate 10.

The cold plate 10 includes a first refrigerant flow path 21 through which a refrigerant flows on a surface on one side in the second direction. The first refrigerant flow path 21 is a space formed by a surface of the partition member 60, to be described below, on the other side in the second direction and a surface of the cold plate 10 on one side in the second direction. A plurality of blades 211 extending in the third direction and disposed side by side parallel to each other in the first direction is provided in the first refrigerant flow path 21.

The refrigerant in the present embodiment is a liquid, and for example, an antifreeze such as an ethylene glycol aqueous solution or a propylene glycol aqueous solution, pure water, or the like is used.

<Pump>

The cooling unit 2 includes a pump 12 that transfers the refrigerant. In the present embodiment, the pump 12 is a centrifugal-type pump and includes a pump chamber 40 through which the refrigerant flows. The pump chamber 40 is disposed on the other side in the second direction of a motor (not illustrated) to be described below. An impeller (not illustrated) which is a rotating body capable of transferring the refrigerant is disposed in the pump chamber 40.

The pump chamber 40 includes a suction port 411 and a discharge port 412. The suction port 411 is provided on an end surface of the tank chamber 50 on the other side in the second direction and communicates with a first tank hole part 16 of the tank chamber 40 to be described below. The discharge port 412 communicates with a second tank hole part 17 to be described below. In the present embodiment, the discharge port 412 and the second tank hole part 17 are connected through the connection pipe 80 and the radiator 70.

The impeller of the pump 12 is supported to be rotatable around a central axis extending in the second direction and is connected to a rotating shaft of the motor. The impeller rotates due to driving of the motor, and thereby the refrigerant flowing into the pump chamber 40 from the suction port 411 is discharged from the discharge port 412.

<Tank>

The cooling unit 2 includes the tank 11. The tank 11 is substantially a cuboid and is formed of a resin material. The tank 11 can be easily formed compared to a case in which the tank 11 is formed of a metal. Then, even in an environment in which moisture or the like adheres thereto, rusting of a surface of the tank 11 can be suppressed. The tank 11 includes a tank chamber 50 in which the refrigerant that has flowed in accumulates. The tank chamber 50 is a recessed part formed by the tank 11 being recessed toward one side in the second direction. The tank chamber 50 is substantially a cuboid. When the cooling unit 2 includes the tank chamber 50, an amount of refrigerant circulating in the cooling device 1 can be increased. A decrease in cooling efficiency of the cooling device 1 can be suppressed by increasing the amount of refrigerant circulating in the cooling device 1.

The tank 11 includes the first tank hole part 16 and the second tank hole part 17. In the present embodiment, the first tank hole part 16 extends in the second direction. The first tank hole part 16 communicates with the suction port 411 of the pump 12. In the present embodiment, the first tank hole part 16 and the suction port 411 communicate with each other in the second direction. A portion of the second tank hole part 17 extends in the second direction. The second tank hole part 17 is connected to the discharge port 412 of the pump directly or indirectly.

In the present embodiment, the pump 12 and the tank 11 are disposed adjacent to each other. Specifically, the tank 11 includes a notch part 14, 14A, 14B in which a side surface is cut out, and at least a portion of the pump 12 is disposed in the notch part 14. The cooling unit 2 can be reduced in size by disposing the pump 12 in the notch part 14.

<Partition Member>

The cooling unit 2 includes the partition member 60. The partition member 60 extends in the first direction and is disposed between the tank 11 and the cold plate 10 in the second direction. Specifically, the partition member 60 closes an opening of the recessed part that forms the tank chamber 50. The tank chamber 50 is formed by an inner surface of the recessed part of the tank 11 and a surface of the partition member 60 on one side in the second direction.

The partition member 60 includes a first hole part 601 and a second hole part 602 that penetrate therethrough in the second direction. The second hole part 602 is provided on one side in the first direction with respect to the first hole part 601. An end portion of the second hole part 602 on one side in the second direction communicates with the second tank hole part 17. The second tank hole part 17 is connected to the pump chamber 40 directly or indirectly. An end portion of the second hole part 602 on the other side in the second direction communicates with the first refrigerant flow path 21. An end portion of the first hole part 601 on one side in the second direction communicates with the tank chamber 50. An end portion of the first hole part 601 on the other side in the second direction communicates with the first refrigerant flow path 21. The refrigerant discharged from the pump chamber 40 passes through the second tank hole part 17 and then passes through the second hole part 602. The refrigerant that has passed through the second hole part 602 flows into the first refrigerant flow path 21. The refrigerant that has flowed into the first refrigerant flow path 21 flows into the tank chamber 50 through the first hole part 601. The refrigerant that has flowed into the tank chamber 50 passes through the first tank hole part 16 and is suctioned into the pump chamber 40 from the suction port 411.

<Cover Member>

The cooling unit 2 further includes a cover member (not illustrated). The cover member is made of a material such as, for example, silicon. The cover member is disposed between the partition member 60 and the cold plate 10 in the second direction. The cover member has a hole (not illustrated) penetrating in the second direction and configured to align and communicate with the second hole part 602 in the second direction. The cover member is attached to a groove part (not illustrated) recessed to one side in the second direction of the partition member 60. The cover member covers one side in the second direction of the plurality of blades 211 of the cold plate 10. Specifically, a surface of the cover member on the other side in the second direction is in contact with end portions of the plurality of blades 211 of the cold plate 10 on one side in the second direction. When the cover member is in contact with the end portions of the plurality of blades 211 on one side in the second direction, the refrigerant can be suppressed from flowing on one side in the second direction of the blades 211, and the refrigerant can flow between the blades 211. When the refrigerant flows through gaps in the first direction of the plurality of blades 211 in the third direction, heat that has been transmitted from the heat generating component 30 to the blades 211 can be efficiently transmitted to the refrigerant.

<Radiator>

The cooling device 1 further includes the radiator 70. The radiator 70 includes a plurality of fins 71 for cooling and a pipe 72. The fins 71 are formed on a flat plate and stand upward in the second direction. The plurality of fins 71 is disposed parallel to each other at equal intervals. The pipe 72 is inserted into holes (not illustrated) of the plurality of fins 71 and fixed to the plurality of fins 71 by welding. At this time, a direction in which the pipe 72 extends and a direction in which the fins 71 extend are perpendicular to each other. The pipe 72 has a hollow inside and thus forms a pipe flow path 721 through which the refrigerant passes. In the present embodiment, the pipe flow path 721 extends in the first direction. An end portion of the pipe flow path 721 on the other side in the first direction is connected to the second tank hole part 17 directly or indirectly. An end portion of the pipe flow path 721 on one side in the first direction communicates with the discharge port 412 directly or indirectly. As will be described below, the end portion of the pipe flow path 721 on the other side in the first direction may be connected to the second tank hole part 17 through, for example, the connection pipe 80. The end portion of the pipe flow path 721 on one side in the first direction may be connected to the discharge port 412 through, for example, the connection pipe 80. Also, a plurality of pipe flow paths 721 may be disposed in the first direction.

The cooling device 1 further includes the connection pipe 80. The connection pipe 80 has a hollow inside and is formed as an elastic body of such as, for example, a rubber. The refrigerant flows inside the connection pipe 80. The connection pipe 80 connects the pump 12 and the radiator 70. Specifically, one end of the connection pipe 80 communicates with the end portion of the pipe flow path 721 on one side in the first direction, and the other end of the connection pipe 80 communicates with the discharge port 412. The connection pipe 80 connects the tank 11 and the radiator 70. Specifically, the other end of the connection pipe 80 is connected to the end portion of the pipe flow path 721 on the other side in the first direction, and one end of the connection pipe 80 is connected to the second tank hole part 17.

(Operation of Cooling Device)

The pump 12 is driven with the heat generating component 30 to be cooled such as, for example, a central processing unit (CPU) brought into contact with a surface of the cold plate 10 on the other side in the second direction. Thereby, the refrigerant circulates in the order of the first refrigerant flow path 21, the tank chamber 50, the pump chamber 40, and the pipe flow path 721. Heat generated by the heat generating component 30 is transmitted to the cold plate 10. The heat transmitted to the cold plate 10 is transferred to the refrigerant flowing through the first refrigerant flow path 21. Thereby, heat dissipation of the refrigerant is performed via the radiator 70, and a temperature rise in the heat generating component 30 can be suppressed.

The first tank hole part 16 of the tank chamber 50 is disposed on one side in the first direction with respect to the first hole part 601.

The pump chamber 40 may be filled with a refrigerant. Air that has entered the cooling device 1 circulates in the cooling device 1 together with the refrigerant. Specifically, the air that has entered the pump chamber 40 is pushed out by the impeller, passes through the pipe flow path 721 of the radiator 70, and enters the first refrigerant flow path 21 of the cold plate 10. The air that has entered the first refrigerant flow path 21 moves in the first refrigerant flow path 21 from one side in the first direction to the other side in the first direction and enters the tank chamber 50 through the first hole part 601. The air that has entered the tank chamber 50 does not move to one side in the first direction but remains at an end portion of the tank chamber 50 on the other side in the first direction. Accordingly, when the first tank hole part 16 is disposed on one side in the first direction with respect to the first hole part 601, the air can be suppressed from entering the pump chamber 40 from the suction port 411. Therefore, a decrease in cooling efficiency of the cooling device 1 can be suppressed.

The tank chamber 50 further includes a tank recess part 55. The tank recess part 55 has a recessed shape that is recessed on one side in the second direction and is substantially a cuboid. The tank recess part 55 is a space that is further recessed on one side in the second direction with respect to the tank chamber 50. The tank recess part 55 may be disposed on the other side in the first direction with respect to the first hole part 601. When the tank recess part 55 is disposed on the other side in the first direction with respect to the first hole part 601, the air flowing into the tank chamber 50 from the first hole part 601 and moving to the other side in the first direction can be stored in the tank recess part 55. When the tank chamber 50 further includes the tank recess part 55, an allowable volume in which air is able to be stored is increased, and a decrease in cooling efficiency of the cooling device 1 can be further suppressed.

In the present embodiment, the tank recess part 55 has been described as substantially a cuboid but is not limited thereto.

In the present embodiment, the first hole part 601 extends parallel to the second direction but is not limited thereto. For example, the first hole part 601 may extend from the other side in the second direction toward one side in the second direction and from one side in the first direction toward the other side in the first direction. That is, when the refrigerant passing through the first hole part 601 is transferred to the other side in the first direction, the air that has passed through the first hole part 601 can smoothly move to the other side in the first direction of the tank chamber 50.

A plurality of cooling units 2 may be provided. FIG. 2 is a perspective view of a plurality of cooling units 2A and 2B.

The cooling units 2A and 2B have the same configuration and the same size. The cooling units 2A and 2B of the present embodiment are disposed to be aligned in the third direction.

The cooling units 2A and 2B are connected in series via connection pipes (80a, 80b, and 80c) and the radiator 70. Specifically, a discharge port 412A of a pump 12A is connected to an end portion of the pipe flow path 721 of the radiator 70 on one side in the first direction through the connection pipe 80a. An end portion of the pipe flow path 721 on the other side in the first direction is connected to the second tank hole part 17B through the connection pipe 80b. A discharge port 412B of the cooling unit 2B is connected to a second tank hole part 17A through the connection pipe 80c. Therefore, the refrigerant circulates in the cooling device 1. When a plurality of cooling units is provided, a plurality of heat radiation components can be cooled while a decrease in cooling efficiency of the cooling device 1 can be suppressed.

(Other)

The embodiment described above is merely an example of the present disclosure. Configurations of the embodiment may be changed as appropriate without departing from the technical spirit of the present disclosure. Also, the embodiments may be implemented in combination within a possible range.

In the above-described embodiment, a centrifugal-type pump has been used, but a diaphragm-type pump, a cascade-type pump, or the like may also be used.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A cooling device comprising:
   a cooling unit,
   wherein the cooling unit includes:
   a cold plate which extends in a first direction;
   a pump and a tank which are disposed on one side in a second direction perpendicular to the first direction of the cold plate; and
   a partition member which extends in the first direction and covers the cold plate on one side in the second direction,
   the cold plate includes a first refrigerant flow path through which a refrigerant flows from one side to the other side in the first direction, the pump includes a pump chamber in which an impeller which is a rotating body and transfers the refrigerant is accommodated, the tank includes a tank chamber which stores the refrigerant and a first tank hole part which communicates with the pump chamber, the partition member includes a first hole part which communicates the first refrigerant flow path and the tank chamber, and the first tank hole part is provided on one side in the first direction with respect to the first hole part, the tank chamber includes a tank recess part, and the one side in the first direction is referred to a direction in which gravity is applied.

2. The cooling device according to claim 1, wherein the tank recess part is a space that is further recessed on one side in the second direction with respect to the tank chamber, and the one side in the second direction is referred to a side on which the tank is disposed with respect to the cold plate.

3. The cooling device according to claim 1, wherein the tank recess part is disposed on the other side in the first direction with respect to the first tank hole part.

* * * * *